United States Patent [19]

Fukusho

[11] Patent Number: 5,565,374
[45] Date of Patent: Oct. 15, 1996

[54] METHOD FOR FABRICATING A SOLID-STATE IMAGE SENSING

[75] Inventor: Takashi Fukusho, Kanagawa, Japan

[73] Assignee: Sony Corporation, Tokyo, Japan

[21] Appl. No.: 464,095

[22] Filed: Jun. 5, 1995

Related U.S. Application Data

[62] Division of Ser. No. 362,920, Dec. 23, 1994, Pat. No. 5,523,609.

[30] Foreign Application Priority Data

Dec. 27, 1993 [JP] Japan ................................. 5-351599

[51] Int. Cl.$^6$ ........................... H01L 31/18; H01L 21/70; H01L 27/00
[52] U.S. Cl. ................................. 437/53; 437/3
[58] Field of Search ............... 437/3, 53; 257/222, 257/223, 225, 228, 231, 232

[56] References Cited

U.S. PATENT DOCUMENTS 5,283,207  2/1994  Haga et al. ................... 437/3
5,432,363  6/1995  Kamisaka et al. ............. 257/232
5,466,612  11/1995  Fuse et al. .................... 437/53

Primary Examiner—Mary Wilczewski
Assistant Examiner—Brian K. Dutton
Attorney, Agent, or Firm—Hill, Steadman & Simpson

[57] ABSTRACT

A method for fabricating a solid-state image sensing device wherein a plurality of sensor regions are arranged in two-dimensions. A plurality of vertical transfer lines are associated with respective vertical rows of the plurality of sensor regions to transfer signal charges read from the sensor regions. A gate electrode is formed on an insulating layer over a signal charge transfer layer formed at the surface of the substrate. A buffer layer is formed containing hydrogen on an interlayer insulating layer over the gate electrode and the sensor regions. The light shielding layer is formed only over the buffer layer.

5 Claims, 4 Drawing Sheets

METHOD FOR FABRICATING A SOLID-STATE IMAGE SENSING

This is a division of application Ser. No. 08/362,920, filed Dec. 23, 1994 now U.S. Pat. No. 5,523,609.

BACKGROUND OF THE INVENTION

1. Field of the Invention

The present invention relates to a solid-state image sensing device, a method of fabricating the same, and a semiconductor device and, more particularly, to the construction of vertical charge transfer regions for transferring signal charges, associated with respective vertical rows of a plurality of sensor regions arranged in two-dimensions, a method of fabricating the vertical charge transfer regions, and a semiconductor device comprising a layer of a hydrogen storage alloy.

2. Description of Related Art

In a solid-state image sensing device, such as a charge-coupled image sensor (CCD), a plurality of sensor regions are arranged in two-dimensions, and vertical transfer lines for vertically transferring signal charges provided by the sensor regions are connected to respective vertical rows of the sensor regions. As shown in FIG. 6, in the vertical transfer line, a gate electrode 64 is formed near sensor regions 62 on a silicon dioxide film 63 formed on a silicon substrate 61, a polycrystalline oxide film 65 is formed over the gate electrode 64, an interlayer insulating layer 66 such as a PSG (phosphate grass film) is deposited over the polycrystalline oxide film 65 by an atmospheric pressure CVD process, and a light shielding layer 67 of a metal film of aluminum or the like is formed over the surface the interlayer insulating layer 66, excluding areas corresponding to the sensor regions 62, to shield a signal charge transfer layer 68 from external light.

When forming the light shielding layer 67 of a metal film after forming the interlayer insulating layer 66 by an atmospheric pressure CVD process in fabricating the charge-coupled image sensor of the aforesaid construction, damage attributable to sputtering or plasma is caused, and impurities diffuse through the interlayer insulating layer 66 into the interface between the silicon substrate 61 and the silicon dioxide film 63 and into the silicon substrate 61 during film forming processes and film processing processes to increase defects in the charge-coupled image sensor.

If the interlayer insulating layer 66 is formed with a comparatively large thickness to obviate such a problem, the quantity of light reflected by the surface of the silicon substrate 61 and falling on the lower surface of the light shielding layer 67 increases when light falls obliquely on the sensor regions 62. Consequently, the reflected light repeats with a multiple reflection between the surface of the silicon substrate 61 and the lower surface of the light shielding layer 67 and between the surface of the silicon substrate 61 and the gate electrode 64, and finally impinges on the signal charge transfer layer 68 to make the signal charge transfer layer 68 emit photoelectrons, which add to smear.

SUMMARY OF THE INVENTION

The present invention has been made in view of those problems and it is therefore an object of the present invention to provide a solid-state image sensing device capable of suppressing smear and of reducing defects in images, and a method of fabricating such a solid-state image sensing device.

Another object of the present invention is to provide a solid-state image sensing device capable of reducing dark current of an intensity dependent on the condition of the interface between a silicon substrate and an oxide film, a method of fabricating such a solid-state image sensing device, and a semiconductor device.

In accordance with the present invention, a solid-state image sensing device comprises a plurality of sensor regions, and a plurality of vertical transfer lines provided for the respective vertical rows of the sensor regions. Each of the vertical transfer lines comprises a charge transfer region for transferring signal charges read from the sensor regions, a gate electrode formed above the charge transfer region through an insulating layer, a light shielding layer formed over the gate electrode through an interlayer insulating layer, and a buffer layer formed under the light shielding layer. The buffer layer contains hydrogen.

In accordance with the present invention, there is provided a process of manufacturing a solid-state image sensing device comprising forming a gate electrode on an insulating layer formed over a signal charge transfer region formed on the side of the surface of a substrate, forming an interlayer insulating layer over the gate electrode and sensor regions, forming a buffer layer over the interlayer insulating layer, and forming a light shielding layer over the surface of the buffer layer excluding an area of the surface corresponding to the sensor regions.

According to another aspect of the present invention, there is provided a method comprising forming a gate electrode over an insulating layer formed over a signal charge transfer region formed on the side of the surface of a substrate, forming an interlayer insulating layer over the gate electrode and sensor regions, forming a buffer layer over the interlayer insulating layer, removing portions of the silicon nitride film corresponding to the sensor regions by etching, forming a light shielding layer only on the silicon nitride film, and then forming a passivation layer over the entire surface. In a preferred embodiment, the buffer layer comprises a silicon nitride film or a silicon oxynitride film. The silicon nitride film may be formed by plasma CVD.

A semiconductor device in accordance with the present invention comprises a hydrogen storage alloy layer of a hydrogen storage alloy, and a buffer layer underlying the hydrogen storage alloy layer.

In the solid-state image sensing device, such as a charge-coupled image sensor, the buffer layer underlying the light shielding layer shielding the vertical transfer line serves as a buffer layer for preventing the diffusion of impurities from the light shielding layer, and damage that will be caused by film forming processes. Since the buffer layer prevents the diffusion of impurities from the light shielding layer and damage attributable to the film forming processes, the interlayer insulating layer may be formed in a comparatively small thickness, and hence the leakage of the reflected light reflected by the surface of the silicon substrate into the vertical transfer line can be suppressed, so that smear can be reduced.

Since the buffer layer underlying the light shielding layer has an agent to supply hydrogen to the interface between the silicon substrate and the silicon dioxide film, the condition of the interface can be improved, which promotes the reduction of dark current.

Since the method of fabricating a solid-state image sensing device, such as a charge-coupled image sensor, forms the buffer layer over the interlayer insulating layer formed over the gate electrode and sensor regions, and forms the light shielding layer over the surface of the buffer layer excluding areas corresponding to the sensor regions, the sensor regions are covered with the buffer layer. The buffer layer serves as a protective film for protecting the sensor regions from contamination in the following processes.

Since another method of fabricating a solid-state image sensing device forms the buffer layer over the interlayer insulating layer formed over the gate electrode and the sensing regions, etches portions of the buffer layer corresponding to the sensor regions and forms the light shielding layer only over the buffer layer, the sensor regions are not covered with the buffer layer and the buffer layer extends only under the light shielding layer. Therefore, sensor regions are covered only with the final protective film, and the spectral characteristics of the sensor regions can be adjusted to desired values by optionally determining the thickness of the protective film.

In a solid-state image sensor including a solid-state image sensing device, dark current can be reduced by holding down the energy level of the interface between the silicon substrate and the silicon dioxide film by hydrogen. Accordingly, when a buffer layer of a buffer layer or the like is formed beneath a hydrogen storage alloy layer of titanium, titanium nitride, titanium oxide, titanium oxynitride or the like, the buffer layer supplies hydrogen into the interface between the silicon substrate and the silicon oxide film, whereby the condition of the interface can be improved to reduce dark current.

BRIEF DESCRIPTION OF THE DRAWINGS

The above and other objects, features and advantages of the present invention will become more apparent from the following description taken in conjunction with the accompanying drawings, in which.

DETAILED DESCRIPTION OF THE PREFERRED EMBODIMENTS

Figure 1:
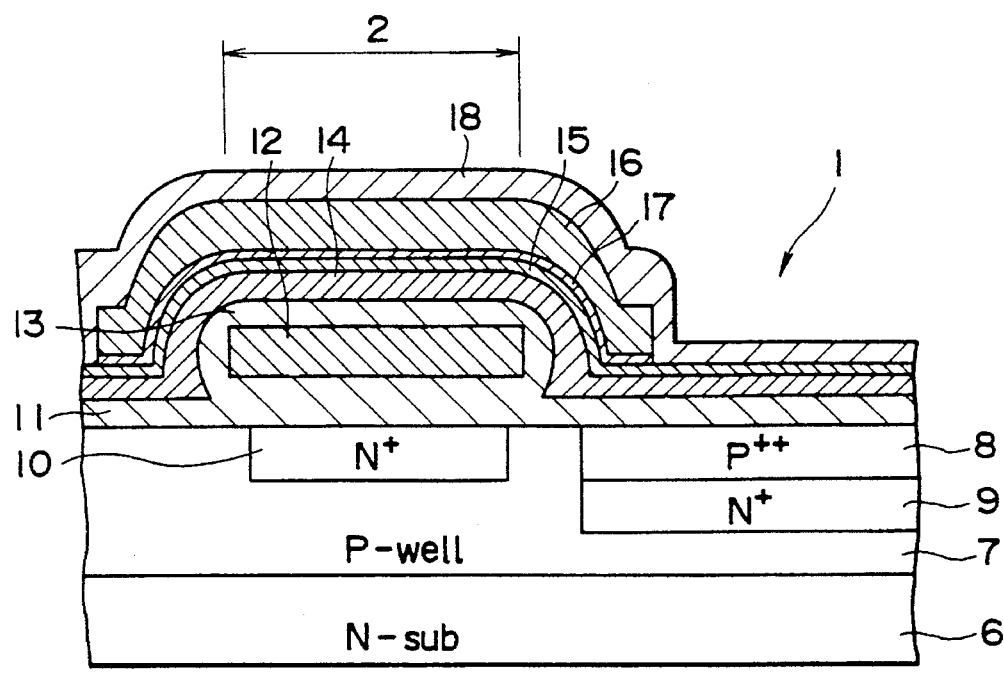
FIG. 1 is a schematic sectional view of an essential portion of a charge-coupled image sensor in a first embodiment according to the present invention, taken on line A–A' in FIG. 2.
Figure 2:
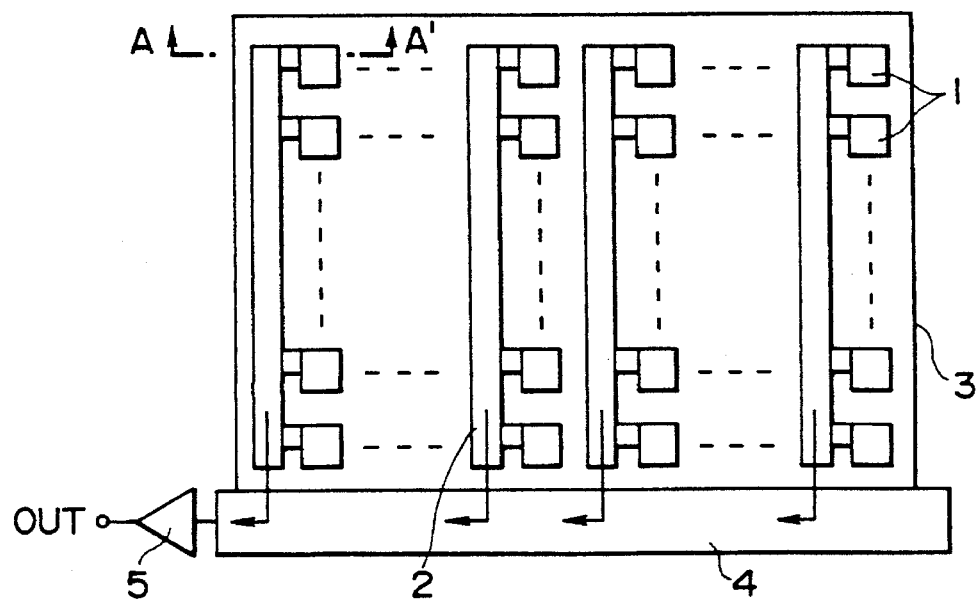
FIG. 2 is a schematic plan view of the charge-coupled image sensor embodying the present invention.

FIGS. 1 and 2 are a schematic sectional view and a schematic plan view, respectively, of an essential portion of a charge-coupled image sensor in a first embodiment according to the present invention.

Referring to FIG. 2, the charge-coupled image sensor has a light sensing unit 3 comprising sensor regions 1 (pixels) for storing electric charges obtained by the photoelectric conversion of incident light, arranged in two-dimensions along horizontal lines and vertical lines, and a plurality of vertical transfer lines 2 (CCD shift registers) connected respectively to the vertical rows of the sensor regions 1 to vertically transfer signal charges stored in the sensor regions 1. Signal charges produced through photoelectric conversion by the sensor regions 1 are read by the vertical transfer line 2 in part of a vertical blanking interval. Part of the signal charges read by the vertical transfer lines 2 corresponding to one scanning line is transferred to a horizontal transfer region 4 (CCD shift register) in part of a horizontal blanking interval. The signal charges for one scanning line are transferred sequentially in a horizontal direction by the horizontal transfer region 4. A charge detector 5, such as a floating diffusion amplifier, is connected to one end of the horizontal transfer region 4. The charge detector 5 detects signal charges transferred by the horizontal transfer region 4 and converts the same into corresponding signal voltages.

FIG. 1 is a sectional view taken on line A–A' in FIG. 2. Referring to FIG. 1, the sensor region 1 is a HAD (hole accumulation diode) structure comprising a hole accumulating layer 8, namely p++-type doped layer formed in a p-type well formed in a n-type silicon substrate 6, and a signal charge accumulating layer 9, namely an n+-type doped layer underlying the p++-type doped layer. The vertical transfer line 2 comprises a signal charge transfer region 10, namely an n+-type doped layer formed in the surface of the silicon substrate 6, and a gate electrode 12 of polycrystalline silicon formed on a silicon dioxide film (or a buffer layer) 11 formed on the silicon substrate 6. The sensor region 1 and the gate electrode 12 are coated with the silicon dioxide film 11, a polycrystalline oxide film, and a interlayer insulating layer 14, such as a PSG film, formed by an atmospheric pressure CVD process formed in that order. A buffer film 15, i.e. a buffer layer, is deposited by, for example, a plasma CVD process over the interlayer insulating layer 14. The buffer film 15 need not necessarily be a buffer layer formed by a plasma CVD process; the same may be a buffer layer or a silicon oxynitride film formed by an ECR plasma CVD process.

A light shielding layer 16 of a metal, such as aluminum, an aluminum alloy, tungsten, molybdenum or such, is formed over the surface of the buffer film 15, excluding areas corresponding to the sensor regions 1. A low-reflectance film (layer) 17 of a titanium alloy, such as a titanium oxynitride, a titanium oxide or a titanium nitride, underlies the light shielding layer 16. The outer surface including the surface of the light shielding layer 16 and the surface of the buffer film 15 covering the sensor regions 1 is covered with a passivation film 18, i.e. a protective film.

Since the low-reflectance film 17 underlies the light shielding layer 16 as mentioned above, light obliquely falling on the sensor region 1 and reflected by the surface of the silicon substrate 6 toward the light shielding layer 16 is absorbed by the low-reflectance film 17. Therefore, the multiple reflection of the light reflected by the surface of the silicon substrate 6 between the surface of the silicon substrate 6 and the lower surface of the light shielding layer 16 and between the surface of the silicon substrate 6 and the gate electrode 12 will not occur, the reflected light will not impinge on the signal charge transfer region 10 to generate photoelectrons and, consequently, creating, a false signal, can be reduced.

Although the low-reflectance film of a titanium alloy must underlie the light shielding layer 16 to use the low-reflectance film for absorbing the reflected light, the low-reflectance film need not underlie the light shielding layer 16 when the same is used for other purposes; that is, the titanium alloy film may be the intermediate layer or the uppermost layer of the light shielding layer 16. In the latter case, the buffer film 15 having an appropriate reflectance and underlying the light shielding layer 16 can be used as a low-reflectance film to reduce smear. The buffer film 15 underlying the light shielding layer 16 including the low-reflectance film 17 prevents sputtering damage, plasma damage and the diffusion of impurities from the light shielding layer 16 when forming the light shielding layer 16 after depositing the interlayer insulating layer 14. Since damage attributable to film forming processes and the diffusion of impurities from the light shielding layer 16 through the interlayer insulating layer 14 into the interface between the silicon substrate 6 and the oxide film 11 and into the silicon substrate 6 can be thus prevented, image defects in the charge-coupled image sensor can be reduced. Since damage and the diffusion of impurities from the light shielding layer 16 can be prevented by the buffer film 15, the interlayer insulating layer 14 may be formed in a comparatively small thickness. Therefore, the leakage of reflected light reflected by the surface of the silicon substrate 6 into the vertical transfer line 2 can be suppressed and, consequently smear attributable to false signals provided by the charge-coupled image sensor can be further reduced.

Incidentally, as is generally known, dark current can be reduced by holding down the energy level of the interface between the silicon substrate 6 and the silicon oxide film 11 with hydrogen. Since the buffer film 15, i.e. a buffer layer containing hydrogen, underlying the light shielding layer 16 supplies hydrogen into the interface between the silicon substrate 6 and the silicon oxide film 11 to improve the condition of the interface, this promotes the reduction of dark current. As explained below, the buffer film 15 may be formed of silicon nitride and is deposited by a plasma CVD process. It is known in the prior art that the silicon nitride in such a process contains hydrogen. See for example "Silicon Processing" by S. Wolf et al Lattice Press, 1986, Pages 191–194.

Figure 3:
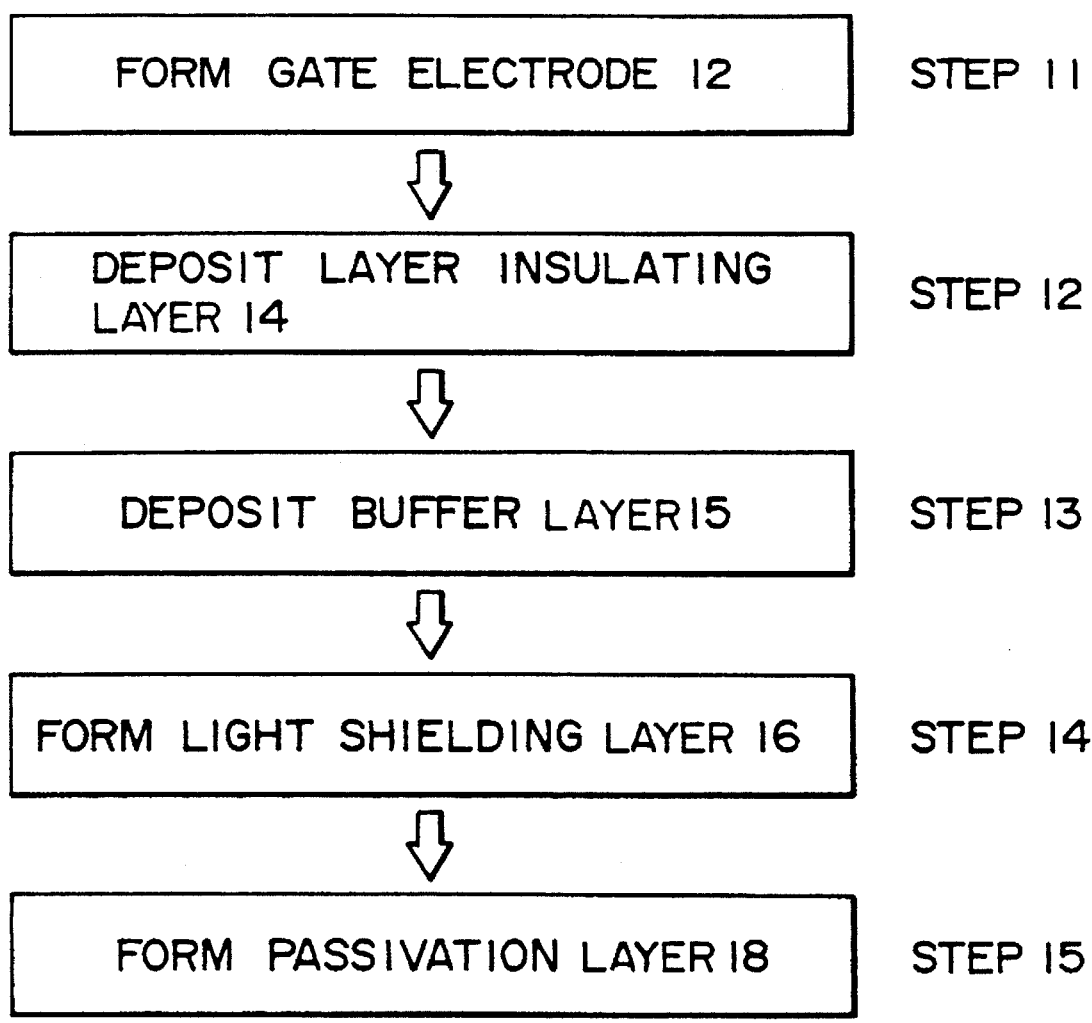
FIG. 3 is a flow chart of a method of fabricating a charge-coupled image sensor, in accordance with the present invention.

A procedure for fabricating the charge-coupled image sensor will be described hereinafter with reference to FIG. 3. The procedure includes steps to be executed after the silicon substrate 6 has been doped, and the sensor regions 1 and the signal charge transfer region 10 of the vertical transfer line 2 have been formed.

In step 11, the gate electrode 12 of polycrystalline silicon is formed on the silicon dioxide film 11 covering the signal charge transfer region 10. In step 12, the interlayer insulating layer 14 is formed by an atmospheric pressure CVD process over the sensor regions 1 and the gate electrode 12 so as to overlie the silicon dioxide film 11 and the polycrystalline oxide film 13. In step 13, the buffer film 15 of silicon nitride is deposited by a plasma CVD process on the interlayer insulating layer 14. In step 14, the light shielding layer 16 is formed over the surface of the low-reflectance film 17, excluding areas corresponding to the sensor regions 1. In step 15, the passivation film 18, i.e., a protective film, is formed over the entire outer surface of the workpiece. As is obvious from FIG. 1, in the charge-coupled image sensor fabricated by the foregoing procedure, the sensor regions 1 are covered with the a buffer film 15 of buffer layer, and the buffer film 15 serves as a protective film for protecting the sensor regions from contamination in the following processes.

Figure 4:
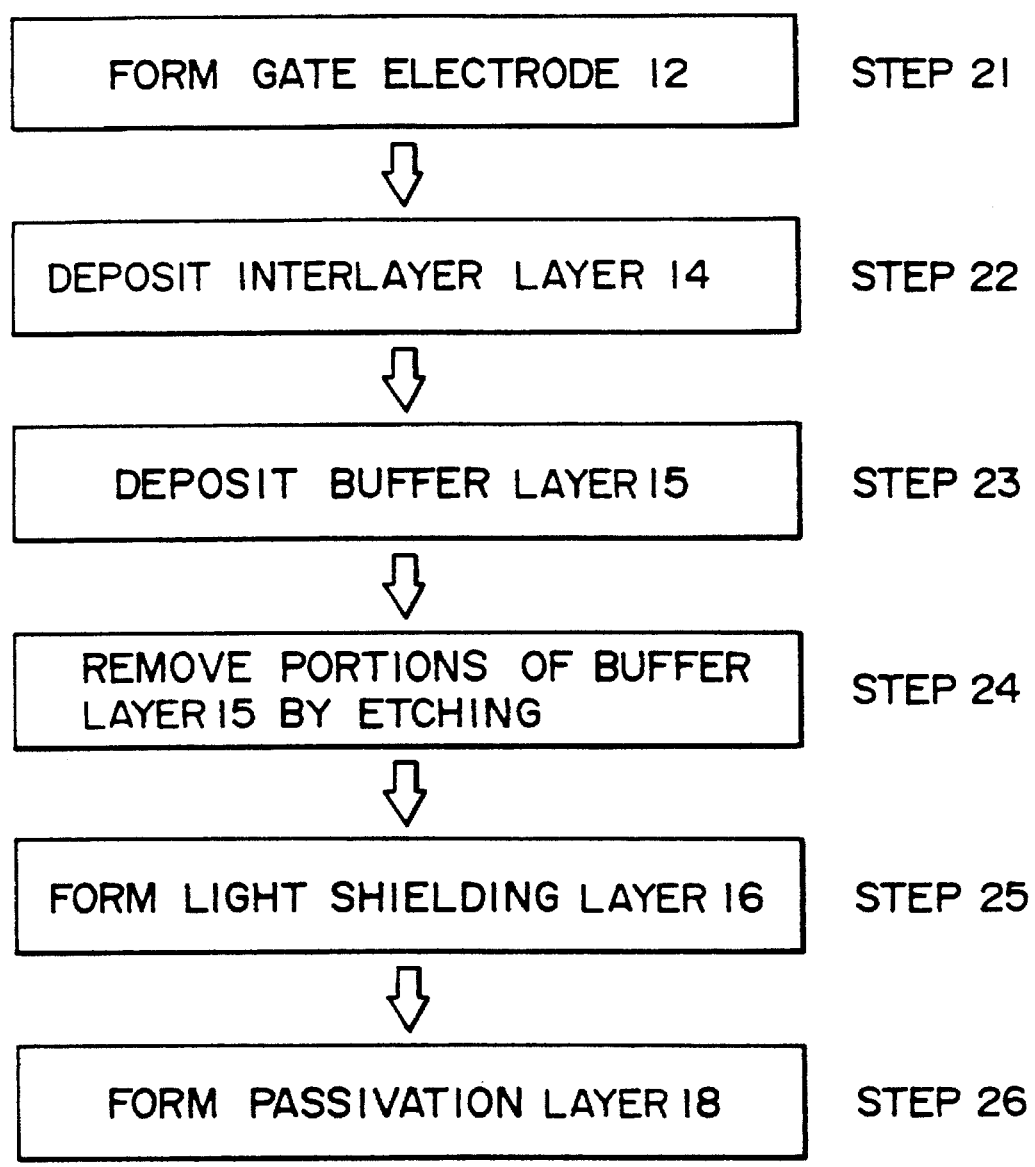
FIG. 4 is a flow chart of another method of fabricating a charge-coupled image sensor, in accordance with the present invention.

Another procedure for fabricating the charge-coupled image sensor, in accordance with the present invention, will be described with reference to FIG. 4. The procedure includes steps to be executed after the silicon substrate 6 has been doped, and the sensor regions 1 and the signal charge transfer region 10 have been formed.

In step 21, the gate electrode 12 of polycrystalline silicon is formed on the silicon dioxide film 11 covering the signal charge transfer region 10. In step 22, the interlayer insulating layer 14 is formed by an atmospheric pressure CVD process on the layer of the silicon dioxide film 11 and the polycrystalline oxide film 13 over the sensor regions 1 and the gate electrode 12. In step 23, the buffer film 15 of silicon nitride is formed by a plasma CVD process over the interlayer insulating layer 14. In step 24, portions of the buffer film 15 corresponding to the sensor regions 1 are removed by etching. In step 25, the low-reflectance film 17 and the light shielding layer 16 of a metal are formed on the remaining portions of the buffer film 15. It is also possible to form the buffer film 15, the low-reflectance film 17 and the light shielding layer 16 in that order over the sensor regions 1 and to remove portions of the buffer film 15, the low-reflectance film 17 and the light shielding layer 16 corresponding to the sensor regions 1 simultaneously by etching. In the final step 26, the entire outer surface of the workpiece is covered with the passivation film 18, i.e. a protective film.

Figure 5:
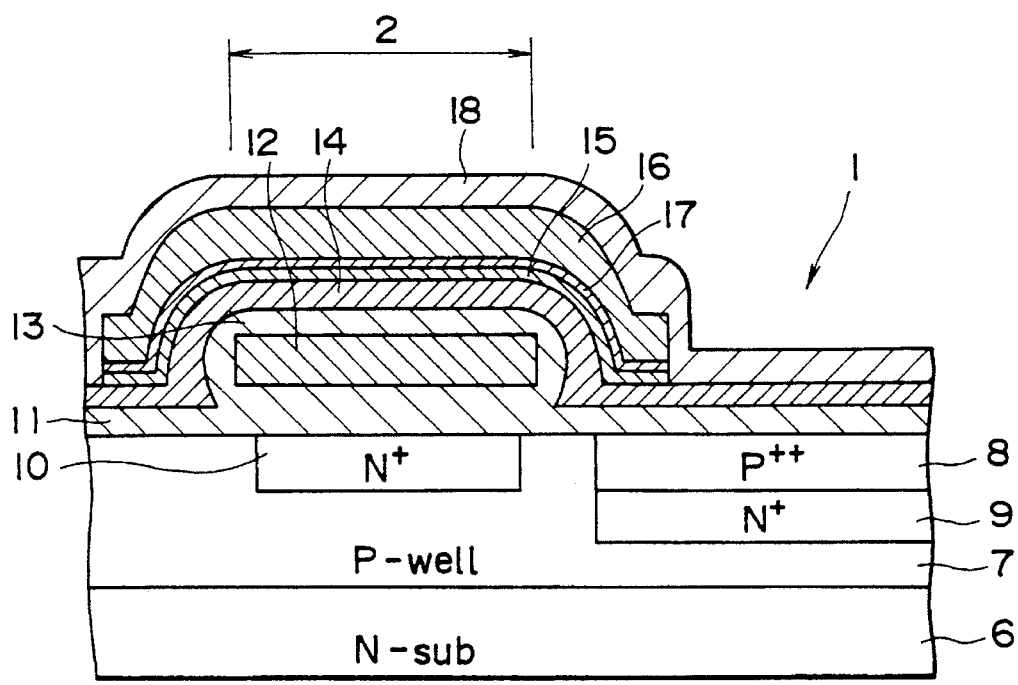
FIG. 5 is a schematic sectional view of an essential portion of a charge-coupled image sensor in a second embodiment according to the present invention.
Figure 6:
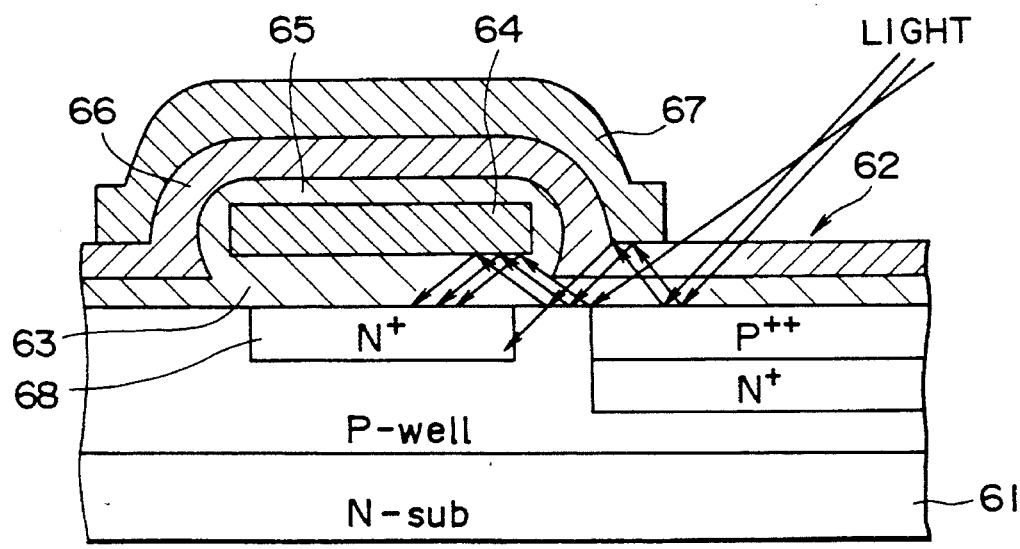
FIG. 6 is a schematic sectional view of an essential portion of a conventional charge-coupled image sensor.

The charge-coupled image sensor thus fabricated by the procedure shown in FIG. 5 has the sensor regions 1 not covered with the buffer film 15 and the sensor regions 1 are covered only with the passivation film 18 as shown in FIG. 5. Therefore, the spectral characteristics of the sensor regions 1 can be adjusted to desired spectral characteristics by optionally determining the thickness of the passivation film 18. Since the charge-coupled image sensor of FIG. 5, similarly to the charge-coupled image sensor of FIG. 1, is provided with the buffer film 15 of silicon nitride beneath the light shielding layer 16 including the low-reflectance film 17, the diffusion of impurities from the light shielding layer 16 and damage attributable to film forming processes can be prevented, and hydrogen can be supplied from the buffer layer into the interface between the silicon substrate 6 and the silicon dioxide film 11 and into the silicon substrate 6 to improve the condition of the interface. Consequently, image defects in the charge-coupled image sensor can be reduced, the interlayer insulating layer 14 can be made thin in thickness to reduce smear. The improvement of the condition of the interface between the silicon substrate 6 and the silicon dioxide film 11 promotes the reduction of dark current.

Although the present invention has been described as applied to the construction of the vertical transfer lines 2 of the foregoing preferred embodiments of the present invention, the present invention is not limited thereto in its practical application and is applicable to various semiconductor devices including DRAMs provided with a layer of a hydrogen storage alloy, such as a titanium alloy or the like. For example, in a semiconductor device provided with a wiring layer of a hydrogen storage alloy and a buffer layer containing hydrogen and formed beneath the wiring layer, hydrogen can be supplied from the buffer layer into the interface between the silicon substrate and the silicon dioxide film to improve the condition of the interface even if hydrogen supplied from an external hydrogen source is absorbed by the wiring layer, whereby the reduction of dark current, the generation of which is dependent on the condition of the interface, can be promoted.

Although the invention has been described in its preferred forms with a certain degree of particularity, obviously many changes and variations may be made therein. It is therefore to be understood that the present invention may be practiced otherwise than as specifically described herein without departing from the scope and spirit thereof.

What is claimed is:

1. A method of fabricating a solid-state image sensing device having a plurality of sensor regions arranged in two-dimensions, and a plurality of vertical transfer lines associated with respective vertical rows of the plurality of sensor regions to transfer signal charges read from the plurality of sensor regions, comprising the steps of:

forming a gate electrode on an insulating layer over a signal charge transfer region formed at a surface of a substrate;

forming a buffer layer containing hydrogen on an interlayer insulating layer over the gate electrode and the plurality of sensor regions; and forming a light shielding layer only over the buffer layer.

2. The method of fabricating a solid-state image sensing device according to claim 1 including the step of forming the buffer layer by a plasma CVD process.

3. A method of fabricating a solid-state image sensing device having a plurality of sensor regions arranged in two-dimensions, and a plurality of vertical transfer lines associated with respective rows of the plurality of sensor regions to transfer signal charges read from the plurality of sensor regions, comprising the steps of:

forming a gate electrode on an insulating layer over a signal charge transfer region formed at a surface of a substrate;

forming a buffer layer containing hydrogen on an interlayer insulating layer over the gate electrode and the plurality of sensor regions;

etching away portions of the buffer layer corresponding to the plurality of sensor regions so that portions of the buffer layer which are remaining do not overlie the sensor regions; and forming a light shielding layer over the surface of remaining portions of the buffer layer, and subsequently forming a passivation layer over the light shielding layer and the interlayer insulating layer.

4. The method of fabricating a solid-state image sensing device according to claim 3 wherein the buffer layer is formed by a plasma CVD process.

5. The method according to claim 3 wherein the passivation layer is formed over an entire upper surface of the solid state image sensing device.

* * * * *